US012185598B2

(12) United States Patent
Zhang

(10) Patent No.: US 12,185,598 B2
(45) Date of Patent: Dec. 31, 2024

(54) DISPLAY PANEL AND A DISPLAY DEVICE

(71) Applicant: Wuhan China Star Optoelectronics Semiconductor Display Technology Co., Ltd., Wuhan (CN)

(72) Inventor: Chunpeng Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/622,427

(22) PCT Filed: Nov. 12, 2021

(86) PCT No.: PCT/CN2021/130317
§ 371 (c)(1),
(2) Date: Dec. 23, 2021

(87) PCT Pub. No.: WO2023/065433
PCT Pub. Date: Apr. 27, 2023

(65) Prior Publication Data
US 2024/0040862 A1 Feb. 1, 2024

(30) Foreign Application Priority Data
Oct. 20, 2021 (CN) .......................... 202111218998.9

(51) Int. Cl.
*H10K 59/126* (2023.01)
*H10K 59/121* (2023.01)
(Continued)

(52) U.S. Cl.
CPC ....... *H10K 59/126* (2023.02); *H10K 59/1213* (2023.02); *H10K 77/111* (2023.02); *H10K 2102/311* (2023.02)

(58) Field of Classification Search
CPC ............. H10K 59/126; H10K 59/1213; H10K 77/111; H10K 2102/311; H10K 59/12; H01L 27/1218
See application file for complete search history.

(56) References Cited

U.S. PATENT DOCUMENTS

2005/0156239 A1* 7/2005 Seko ................. H01L 29/66757
438/164
2016/0062200 A1* 3/2016 Jung ................. H01L 23/53209
438/158
(Continued)

FOREIGN PATENT DOCUMENTS

CN 1402538 A 3/2003
CN 101345261 A 1/2009
(Continued)

OTHER PUBLICATIONS

International Search Report in International application No. PCT/CN2021/130317, mailed on May 25, 2022.
(Continued)

*Primary Examiner* — J. E. Schoenholtz
(74) *Attorney, Agent, or Firm* — PV IP PC; Wei Te Chung

(57) ABSTRACT

The present application discloses a display panel and a display device. The display panel includes a substrate, a light shielding portion, a thin film transistor array layer, and a spacer layer disposed between the substrate and the thin film transistor array layer. The thin film transistor array layer includes a thin film transistor including an active layer including a channel portion. The light shielding portion is embedded in the substrate, and the orthographic projection of the channel portion on the substrate is located within the coverage area of the orthographic projection of the light shielding portion on the substrate.

18 Claims, 7 Drawing Sheets

(51) Int. Cl.
*H10K 77/10* (2023.01)
*H10K 102/00* (2023.01)

(56) References Cited

U.S. PATENT DOCUMENTS

| | | | | |
|---|---|---|---|---|
| 2017/0186831 A1* | 6/2017 | Nam | ............... | H10K 50/814 |
| 2018/0331169 A1* | 11/2018 | Nam | ............... | H10K 50/824 |
| 2019/0391424 A1* | 12/2019 | Ito | ............... | G02F 1/133711 |
| 2024/0049525 A1* | 2/2024 | Zhang | ............... | H10K 59/131 |

FOREIGN PATENT DOCUMENTS

| | | | |
|---|---|---|---|
| CN | 104871321 | A | 8/2015 |
| CN | 105679765 | A | 6/2016 |
| CN | 105810717 | A | 7/2016 |
| CN | 107017344 | A | 8/2017 |
| CN | 107039491 | A | 8/2017 |
| CN | 107256872 | A | 10/2017 |
| CN | 206618932 | U | 11/2017 |
| CN | 108461388 | A | 8/2018 |
| CN | 108807547 | A | 11/2018 |
| CN | 109148684 | A | 1/2019 |
| CN | 110085740 | A | 8/2019 |
| CN | 110504275 | A | 11/2019 |
| CN | 111739910 | A | 10/2020 |
| CN | 211957642 | U | 11/2020 |
| JP | 2004200573 | A | 7/2004 |

OTHER PUBLICATIONS

Written Opinion of the International Search Authority in International application No. PCT/CN2021/130317, mailed on May 25, 2022.

Chinese Office Action issued in corresponding Chinese Patent Application No. 202111218998.9 dated Jan. 5, 2023, pp. 1-6.

* cited by examiner

DISPLAY PANEL AND A DISPLAY DEVICE

CROSS-REFERENCE TO RELATED APPLICATION

This application is a national phase application under 35 U.S.C. § 371 of PCT Application No. PCT/CN2021/130317 filed Nov. 12, 2021, which claims priority to Chinese Application No. 202111218998.9 filed Oct. 20, 2021, the contents of which are incorporated herein by reference in their entirety.

FIELD OF THE INVENTION

The application relates to a field of display technology, and in particular to a display panel and a display device containing the display panel.

BACKGROUND OF THE INVENTION

Organic light-emitting diodes (OLED) display panel has advantages of self-emitting, high contrast, thin thickness, wide viewing angles, and fast reaction speed, etc., which is representative of a new generation of flat display technology and is increasingly appreciated by the industry. The OLED display panel not only can be thinner in volume, but also reduce power consumption, thereby helping to improve endurance of the corresponding product. Meanwhile, due to bendability and flexibility of a flexible OLED display panel, its durability is also higher than that of an ordinary hard display panel. Flexible OLED display panels can be widely used in a variety of products with display functions, such as tablets, televisions, mobile terminals, and a variety of wearable devices.

In the OLED display panel, a source electrode and a drain electrode transmit electrical signals through a channel portion of an active layer, and electrical characteristics of the channel portion of the active layer change after being illuminated by a backlight, thereby affecting transmission of electrical signals between the source electrode and the drain electrode, and affecting the display effect of the OLED display panel.

At present, a light shielding layer is usually disposed between a substrate and the active layer to block light from irradiating a channel of the active layer. However, the light shielding layer is generally disposed directly below the channel and is relatively close to the channel. As the light shielding layer is also loaded with a voltage, the voltage in the light shielding layer affects the electrical characteristics of the channel, affecting the transmission of electrical signals between the source electrode and the drain electrode, and affecting the display effect of the OLED display panel.

TECHNICAL PROBLEMS

An embodiment of the present application provides a display panel and a display device, which can extend a distance between a light shielding layer and an active layer, and further extend a distance between the light shielding layer and a channel portion, so as to reduce an influence on the channel portion after a voltage is applied to the light shielding layer, and improve a display effect of the display panel.

TECHNICAL SOLUTIONS

To solve the above technical problems, an embodiment of the present application provides a display panel, comprising:

a substrate;
a thin film transistor array layer disposed on one side of the substrate, including at least one thin film transistor, wherein the thin film transistor includes an active layer disposed on one side of the substrate, the active layer includes a channel portion and electrical connection portions disposed on both sides of the channel portion; and at least one spacer layer is disposed between the substrate and the thin film transistor array layer; and
a light shielding portion embedded in the substrate, and an orthographic projection of the channel portion on the substrate is located within a coverage area of the orthographic projection of the light shielding portion on the substrate.

In an embodiment of the present application, the substrate includes a first sub-layer and a second sub-layer which are laminated with each other, the second sub-layer is disposed on a side of the spacer layer away from the thin film transistor array layer, the first sub-layer is disposed on a side of the second sub-layer away from the spacer layer, and the light shielding portion is disposed between the first sub-layer and the second sub-layer.

In one embodiment of the present application, the first sub-layer comprises a flexible material, and the second sub-layer comprises a water oxygen barrier material.

In one embodiment of the present application, the substrate further includes a third sub-layer disposed on a side of the second sub-layer away from the first sub-layer, and the third sub-layer includes the flexible material.

In one embodiment of the present application, the substrate further includes a fourth sub-layer disposed on a side of the first sub-layer away from the second sub-layer, and the fourth sub-layer includes the flexible material.

In one embodiment of the present application, the flexible material comprises at least one of polyimide, polycarbonate, polyethersulfone, poly(ethylene terephthalate), poly(ethylene naphthalate), or polyaryl compounds;

The water oxygen barrier material includes at least one of silicon nitride or silicon oxide.

In an embodiment of the present application, the fourth sub-layer has at least one convex portion on the side close to the first sub-layer, the first sub-layer has at least one concave portion corresponding to at least one of the convex portions on the side close to the fourth sub-layer, and the convex portion is engaged into the concave portion.

In one embodiment of the present application, the substrate further includes a fifth sub-layer disposed on a side of the first sub-layer away from the second sub-layer, and the second sub-layer and the fifth sub-layer both comprise a flexible material, and the first sub-layer comprises a water oxygen barrier material.

In one embodiment of the present application, the flexible material comprises at least one of polyimide, polycarbonate, polyethersulfone, poly(ethylene terephthalate), poly(ethylene naphthalate), or polyaryl compounds;

The water oxygen barrier material includes at least one of silicon nitride or silicon oxide.

In an embodiment of the present application, a groove is disposed on a side of the first sub-layer close to the second sub-layer, and the light shielding portion is disposed in the groove.

In one embodiment of the present application, the thin film transistor array layer includes a metal conductive portion disposed on a side of the spacer layer away from the substrate, the display panel includes a contact hole between the metal conductive portion and the light shielding portion, and the metal conductive portion contacts the light shielding portion through the contact hole by overlapping.

In an embodiment of the present application, the thin film transistor includes at least one gate electrode disposed on the active layer side and a source/drain electrode disposed on the at least one gate electrode side, and the metal conductive portion is disposed on the same layer as any one of the at least one gate electrode and the source/drain electrode.

In one embodiment of the present application, the display panel includes a plurality of pixel regions, the thin film transistor array layer includes a plurality of the thin film transistors, the plurality of the thin film transistors include a switching transistor and a driving transistor which are disposed within each of the pixel regions and electrically connected, wherein an orthographic projection of the active layer of the switching transistor on the substrate and an orthographic projection of the active layer of the driving transistor on the substrate both are located within an area covered by the orthographic projection of the light shielding portion on the substrate.

According to the purposes described herein above, the present application provides a display device comprising a display panel and a device body, and the display panel is integrated with the device body;

The display panel comprises:
a substrate;
a thin film transistor array layer disposed on one side of the substrate, including at least one thin film transistor, wherein the thin film transistor includes an active layer disposed on one side of the substrate, the active layer includes a channel portion and electrical connection portions disposed on both sides of the channel portion; and at least one spacer layer is disposed between the substrate and the thin film transistor array layer; and
a light shielding portion embedded in the substrate, and an orthographic projection of the channel portion on the substrate is located within a coverage area of the orthographic projection of the light shielding portion on the substrate.

In an embodiment of the present application, the substrate includes a first sub-layer and a second sub-layer which are laminated with each other, the second sub-layer is disposed on a side of the spacer layer away from the thin film transistor array layer, the first sub-layer is disposed on a side of the second sub-layer away from the spacer layer, and the light shielding portion is disposed between the first sub-layer and the second sub-layer.

In one embodiment of the present application, the first sub-layer comprises a flexible material, and the second sub-layer comprises a water oxygen barrier material.

In one embodiment of the present application, the substrate further includes a third sub-layer disposed on a side of the second sub-layer away from the first sub-layer, and the third sub-layer includes the flexible material.

In one embodiment of the present application, the substrate further includes a fourth sub-layer disposed on a side of the first sub-layer away from the second sub-layer, and the fourth sub-layer includes the flexible material.

In one embodiment of the present application, the substrate further includes a fifth sub-layer disposed on a side of the first sub-layer away from the second sub-layer, and the second sub-layer and the fifth sub-layer both include a flexible material, and the first sub-layer includes a water oxygen barrier material.

In one embodiment of the present application, the thin film transistor array layer includes a metal conductive portion disposed on a side of the spacer layer away from the substrate, the display panel includes a contact hole between the metal conductive portion and the light shielding portion, and the metal conductive portion overlaps the light shielding portion through the contact hole.

BENEFICIAL EFFECTS

Compared with the prior art, by inserting the light shielding portion into the substrate, the present application increases the distance between the light shielding portion and the active layer, reduces the influence of the light shielding portion after the application of the voltage on the channel portion, and improves the display effect of the display panel.

DESCRIPTION OF THE DRAWINGS

The technical solutions and other beneficial effects of the present application will be apparent from the detailed description of the specific embodiments of the present application with reference to the accompanying drawings.

EMBODIMENTS OF THE INVENTION

Figure 1:
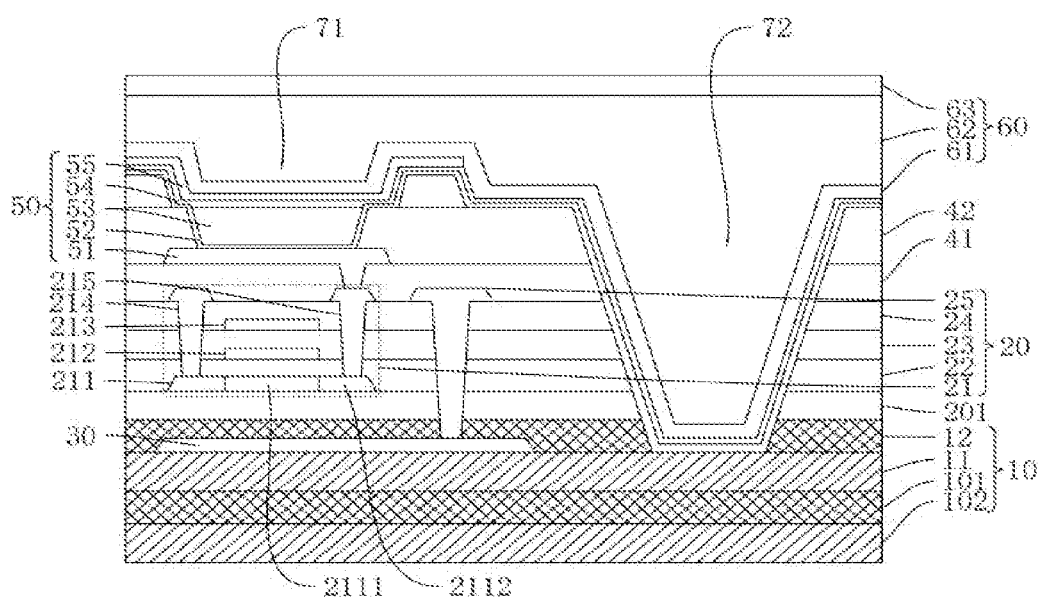
FIG. 1 is a schematic structural diagram of a display panel according to an embodiment of the present application.

The following describes the technical solutions of the embodiments of the present application clearly and completely with reference to the accompanying drawings of the embodiments of the present application. It will be apparent that the described embodiments are only some but not all of the embodiments of the present application. Based on the embodiments of the present application, all other embodiments obtained by those skilled in the art without creative effort fall within the scope of the present application.

The following disclosure provides many different embodiments or examples for implementing the different structures of the present application. In order to simplify the disclosure of the present application, the components and settings of a specific examples will be described below. Of course, they are merely examples and are not intended to limit the application. In addition, reference numerals and/or reference letters may be repeatedly used in different examples of the present application for the purpose of simplicity and clarity, which in itself does not indicate the relationship between the various embodiments and/or settings discussed. Furthermore, the present application provides examples of various specific processes and materials, but one of ordinary skill in the art may be aware of the application of other processes and/or the use of other materials.

An embodiment of the present application provides a display panel. Referring to FIG. 1, the display panel comprises a substrate 10, a thin film transistor array layer 20, at least one spacer layer 201, and a light shielding portion 30.

Further, the thin film transistor array layer 20 is disposed on one side of the substrate 10, and the thin film transistor array layer 20 includes at least one thin film transistor 21, wherein the thin film transistor 21 includes an active layer 211 disposed on one side of the substrate 10, and the active layer 211 includes a channel portion 2111, and electrical connection portions 2112 located on both sides of the channel portion 2111.

At least one spacer layer 201 is disposed between the substrate 10 and the thin film transistor array layer 20.

The light shielding portion 30 is embedded in the substrate 10, and an orthographic projection of the channel portion 2111 on the substrate 10 is located within a coverage area of the orthographic projection of the light shielding portion 30 on the substrate 10.

It should be noted that although a number of layers of the spacer layer 201 is illustrated as one layer in subsequent embodiments of the present application, the number is not limited.

In the application implementation process, in the conventional display panel, particularly in a transparent display panel, the channel portion of the active layer is often irradiated by a backside ambient light, which in turn affects the electrical properties of the active layer. Therefore, generally, the light shielding layer is disposed at a position corresponding to the active layer above the substrate to shield the incident light from a backside, so as to prevent the electrical properties of the active layer from being affected. In addition, in order to avoid the light shielding layer being in a suspended state, and therefore voltage on the light shielding layer is unstable, which in turn affects the electrical properties of the electrical elements located above the light shielding layer, a voltage is generally applied to the light shielding layer to improve the stability of the voltage. However, at present, the light shielding layer is relatively close to the channel portion of the active layer, and after the application of the voltage to the light shielding layer, electrical properties of the channel portion will also be affected. Therefore, in the embodiments of the present application, by embedding the light shielding portion 30 into the substrate 10, a distance between the light shielding portion and the channel portion 2111 is increased, which can effectively reduce an effect of the application of the voltage to the shielding portion 30 on the electrical properties of the channel portion 2111, further improve the stability of the thin film transistor 21, and improve the display effect of the display panel.

Specifically, the display panels as shown in the schematic structural diagrams illustrating the embodiments of the present application are described in the following specific embodiments.

Referring to FIG. 1, in an embodiment of the present application, the display panel includes a substrate 10, a spacer layer 201 disposed on a side of the substrate 10 close to a display surface of the display panel, a thin film transistor array layer 20 disposed on a side of the spacer layer 201 away from the substrate 10, a light shielding portion 30 embedded in the substrate 10, a planarization layer 41 disposed on a side of the thin film transistor array layer 20 away from the substrate 10, a pixel definition layer 42 disposed on a side of the planarization layer 41 away from the thin film transistor array layer 20, a light emitting device layer 50 disposed on a side of the planarization layer 41 away from the thin film transistor array layer 20, and an encapsulation layer 60 disposed on a side of the pixel definition layer 42 away from the planarization layer 41.

Specifically, the thin film transistor array layer 20 includes a thin film transistor 21 and a functional layer covering the thin film transistor 21, wherein the functional layer includes an interlayer insulating layer 22 disposed on a side of the spacer layer 201 away from the substrate 10, a first gate insulating layer 23 disposed on a side of the interlayer insulating layer 22 away from the spacer layer 201, and a second gate insulating layer 24 disposed on a side of the first gate insulating layer 23 away from the interlayer insulating layer 22. The thin film transistor 21 includes an active layer 211 disposed on the spacer layer 201 and covered by the interlayer insulating layer 22, corresponding to the light shielding portion 30; a first gate electrode 212 disposed on the interlayer insulating layer 22 and covered by the first gate insulating layer 23, corresponding to the active layer 211; a second gate electrode 213 disposed on the first gate insulating layer 23 and covered by the second gate insulating layer 24, corresponding to the first gate electrode 212; and a source electrode 214 and a drain electrode 215 disposed on the second gate insulating layer 24 and covered by the planarization layer 41, which are located above two sides of the active layer 211 respectively. The active layer 211 includes a channel portion 2111 corresponding to the first gate electrode 212, and two electrical connection portions 2112 respectively positioned on both sides of the channel portion 2111 and corresponding to the source electrode 214 and the drain electrode 215 respectively. The source electrode 214 and the drain electrode 215 are respectively overlapped with two electrical connection portions 2112 on both sides of the active layer 211 through via holes passing through the second gate insulating layer 24, the first gate insulating layer 23, and the interlayer insulating layer 22. Specifically, the electrical connection portion 2112 that overlaps the source electrode 214 is a portion of the active layer 211 corresponding to a source doping region, and the electrical connection portion 2112 that overlaps the drain electrode 215 is a portion of the active layer 211 corresponding to a drain doping region.

It will be understood that the thin film transistor 21 in this embodiment of the present application is illustrated as a double-gate structure. However, the thin film transistor 21 provided in this embodiment of the present application may also be a single-gate structure or another type of thin film transistor, which is not limited here.

It should be noted that the orthographic projection of the channel portion 2111 on the substrate 10 is located within the coverage area of the orthographic projection of the light shielding portion 30 on the substrate 10.

The planarization layer 41 covers the source electrode 214 and the drain electrode 215, and a pixel definition layer 42 is disposed on the planarization layer 41 and a multi-pixel opening 71 is defined on the pixel definition layer 42, wherein, a light emitting device layer 50 includes an anode 51 disposed on the planarization layer 41, corresponding to the multi-pixel opening 71, and the multi-pixel opening 71 exposes an upper surface of the anode 51, and the light emitting device layer 50 further includes, corresponding to the multi-pixel opening 71, a hole transport layer 52 disposed on the anode 51, a light emitting layer 53, an electron transport layer 54, and a cathode 55, wherein the anode 51 is electrically connected to the drain 215 through a via hole passing through the planarization layer 41.

It should be noted that, in the embodiment of the present application, the display panel includes a bendable region, and the display panel further includes a deep hole 72 which is defined corresponding to the bendable region. The deep hole 72 passes through the pixel definition layer 42, the planarization layer 41, the second gate insulating layer 24, the first gate insulating layer 23, the interlayer insulating layer 22, the spacer layer 201, and a portion of the substrate 10, to reduce bending stress of the display panel in the bendable region and further improve bending performance of the display panel in the bendable region.

The encapsulation layer 60 includes a first inorganic encapsulation layer 61 covering the pixel definition layer 42 and the light emitting device layer 50, an organic encapsulation layer 62 covering the first inorganic encapsulation layer 61 and filling the deep hole 72, and a second inorganic encapsulation layer 63 covering the organic encapsulation layer 62. Optionally, the materials of the first inorganic encapsulation layer 61 and the second inorganic encapsulation layer 63 includes one or more of Al2O3, TiO2, SiNx, SiCNx, and SiOx, and the materials of the organic encapsulation layer 62 comprises one or more of acrylic, hexamethyldimethicone, polyacrylates, polycarbonates, and polystyrenes.

It should be noted that the embodiment of the present application does not limit the type of the thin film transistor 21 and this is illustrated only to explain the above-described structure. That is, any display panel in which a light shielding layer 30 is embedded in a substrate 10 so as to protect a channel portion 2111 falls within the scope of the invention.

Further, in the present embodiment, the substrate 10 includes a first sub-layer 11 and a second sub-layer 12 which are disposed layer-wise, the light shielding portion 30 is disposed between the first sub-layer 11 and the second sub-layer 12, and the second sub-layer 12 is disposed between the first sub-layer 11 and the spacer layer 201. Further, the substrate 10 further includes a first water oxygen barrier sub-layer 101 and a first flexible sub-layer 102, which are disposed on a side of the first sub-layer 11 away from the second sub-layer 12, and the first water and/or oxygen barrier sub-layer 101 is disposed between the first sub-layer 11 and the first flexible sub-layer 102.

A material of the first sub-layer 11 and the first flexible sub-layer 102 each includes a flexible material, and a material of the second sub-layer 12 and the first water and/or oxygen barrier sub-layer 101 each includes an water and/or oxygen barrier material.

Optionally, the flexible material comprises at least one of polyimide, polycarbonate, polyethersulfone, poly(ethylene terephthalate), poly(ethylene naphthalate), or polyaryl compounds. The water oxygen barrier material includes at least one of silicon nitride or silicon oxide.

In the present embodiment, the thin film transistor array layer 20 further includes a metal conductive portion 25 disposed on the second gate insulating layer 24 and covered by the planarization layer 41, and the metal conductive portion 25 is electrically connected to the light shielding portion 30 through contact holes passing through the second gate insulating layer 24, the first gate insulating layer 23, the interlayer insulating layer 22, the spacer layer 201, and the second sub-layer 12, to apply a voltage to the light shielding portion 30, which can improve the voltage stability, and reduce the influence on the electrical properties of the thin film transistor 21 above the light shielding portion 30.

It should be noted that in the present embodiment, the metal conductive portion 25 may be connected to a same signal trace as the source electrode 214, that is, a VDD signal trace, so as to apply a voltage to the light shielding portion 30. However, this embodiment is not limited to this. Alternatively, the metal conductive portion 25 may be connected to other signal lines, or a single signal line may be connected to the metal conductive portion 25, so as to apply an additional voltage to the metal conductive portion 25, which are not specifically defined here. Further, in other embodiments, the metal conduction portion 25 may be in a same layer as the first gate electrode 212 or the second gate electrode 213.

In view of the above, in the present embodiment, by embedding the light shielding portion 30 in the substrate 10, that is, inserting between the first sub-layer 11 and the second sub-layer 12, compared with the prior art display panels wherein the light shielding portion 30 is disposed on a surface of the substrate 10 facing the display panel, the display panel of the present application can extend the distance between the light shielding portion 30 and the active layer 211, thereby reducing the influence of the voltage applied to the light shielding portion 30 on the electrical properties of the channel portion 2111, improving the stability of the thin film transistor 21, and improving the display effect of the display panel.

Figure 2:
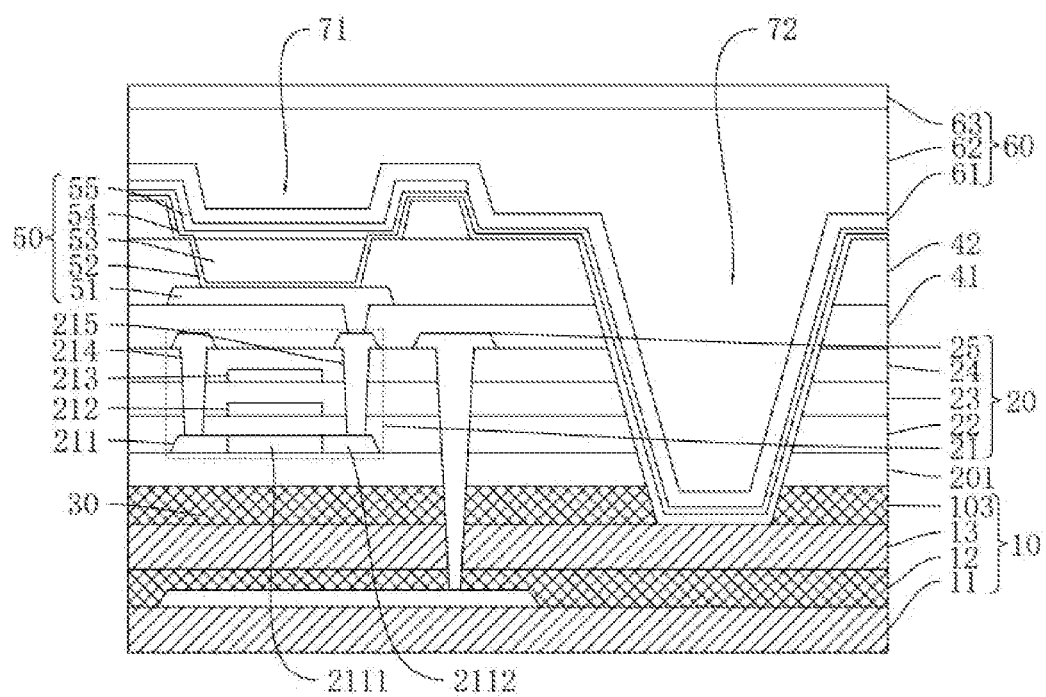
FIG. 2 is another schematic structural diagram of a display panel according to an embodiment of the present application.

Referring to FIG. 2, in another embodiment of the present application, the display panel includes a substrate 10, a spacer layer 201 disposed on a display surface side of the substrate 201, a thin film transistor array layer 20 disposed on a side of the spacer layer 201 away from the substrate 10, a light shielding portion 30 embedded in the substrate 10, a planarization layer 41 disposed on a side of the thin film transistor array layer 20 away from the substrate 10, a pixel definition layer 42 disposed on a side of the planarization layer 41 away from the thin film transistor array layer 20, a light emitting device layer 50 disposed on a side of the planarization layer 41 away from the thin film transistor array layer 20, and a package layer 60 disposed on a side of the pixel definition layer 42 away from the planarization layer 41 away from the planarization layer 41.

Further, in the present embodiment, the substrate 10 includes a first sub-layer 11 and a second sub-layer 12 which are layer-wise disposed, and the light shielding portion 30 is disposed between the first sub-layer 11 and the second sub-layer 12, and the first sub-layer 11 is disposed on a side of the second sub-layer 12 away from the spacer layer 201. In addition, the substrate 10 further includes a third sub-layer 13 and a second water and/or oxygen barrier sub-layer 103 disposed between the second sub-layer 12 and the spacer layer 201, and the third sub-layer 13 is located between the second sub-layer 12 and the second water and/or oxygen barrier sub-layer 103.

The first sub-layer and the third sub-layer each include a flexible material, and the second sub-layer and the second water and/or oxygen barrier sub-layer 103 each include a water and/or oxygen barrier material.

Optionally, the flexible material includes at least one of polyimide, polycarbonate, polyethersulfone, poly(ethylene terephthalate), poly(ethylene naphthalate), or polyaryl compounds. The water oxygen barrier material includes at least one of silicon nitride or silicon oxide.

In the present embodiment, the thin film transistor array layer 20 further includes a metal conductive portion 25 disposed on the second gate insulating layer 24 and covered by the planarization layer 41, and the metal conductive portion 25 is electrically connected to the light shielding portion 30 through contact holes passing through the second gate insulating layer 24, the first gate insulating layer 23, the interlayer insulating layer 22, the spacer layer 201, the second water oxygen barrier sub-layer 103, the third sub-layer 13, and the second sub-layer 12, to apply a voltage to the light shielding portion 30, so as to improve the voltage stability thereof and reduce the influence on the electrical properties of the thin film transistor 21 over the light shielding portion 30.

In view of the foregoing, in the embodiment, by embedding the light shielding portion 30 in the substrate 10, i.e., between the first sub-layer 11 and the second sub-layer 12, there are newly added sub-layer 13 and the second water oxygen barrier layer 103 compared with the preceding embodiment, the display panel of the present application can further extend the distance between the light shielding portion and the active layer 211, thereby reducing the influence of the voltage applied to the light shielding portion 30 on the electrical properties of the channel portion 2111, improving the stability of the thin film transistor 21, and improving the display effect of the display panel.

Figure 3:
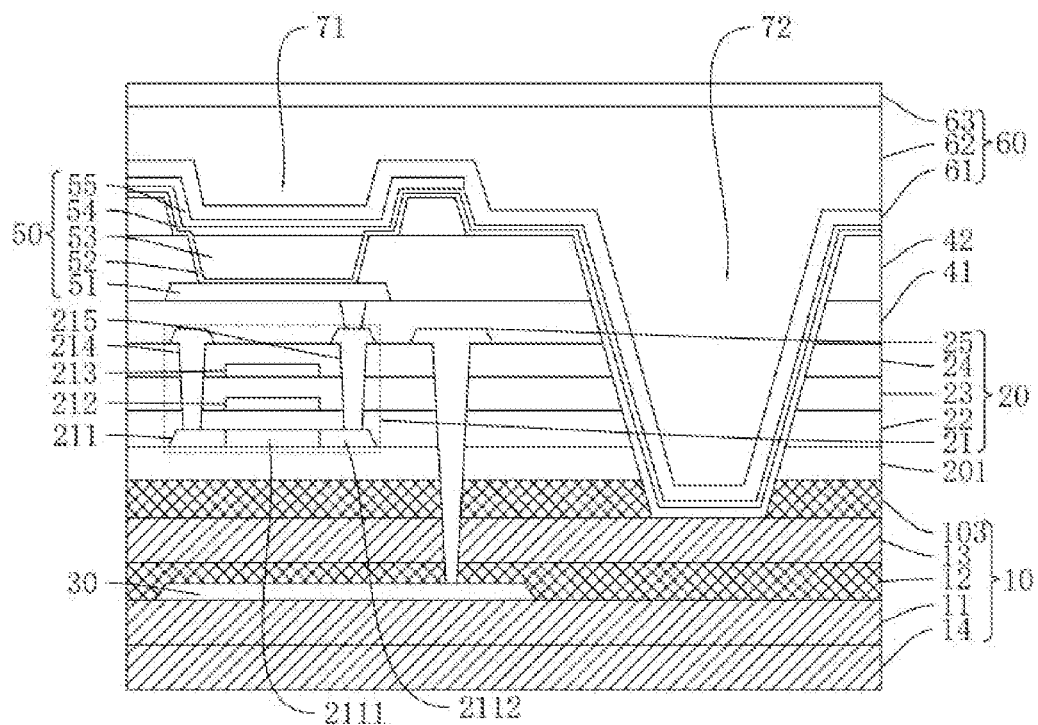
FIG. 3 is another schematic structural diagram of a display panel according to an embodiment of the present application.

Referring to FIG. 3, in another embodiment of the present application, the display panel includes a substrate 10, a spacer layer 201 disposed on the substrate side closing to a display surface of the display panel, a thin film transistor array layer disposed on the spacer layer 201 side away from the substrate 10, a light shielding portion 30 embedded in the substrate 10, a planarization layer 41 disposed on a side of the thin film transistor array layer 20 away from the substrate 10, a pixel definition layer 42 disposed on a side of the planarization layer 41 away from the thin film transistor array layer 20, a light emitting device layer 50 disposed on the planarization layer 41 side away from the thin film transistor array layer 20, and a package layer 60 disposed on the pixel definition layer 42 side away from the planarization layer 41 side away from the planarization layer 41.

Further, in contrast to a previous embodiment, in the present embodiment, the substrate 10 includes a first sub-layer 11 and a second sub-layer 12 which are layer-wise disposed, the light shielding portion 30 is disposed between the first sub-layer 11 and the second sub-layer 12, and the first sub-layer 11 is disposed on a side of the second sub-layer 12 away from the spacer layer 201. Further, the substrate 10 also includes a fourth sub-layer 14 disposed on a side of the first sub-layer 11 away from the second sub-layer 12, a third sub-layer 13 disposed on a side of the second sub-layer 12 away from the first sub-layer 11, and a second water and/or oxygen barrier sub-layer 103 disposed on a side of the third sub-layer 13 away from the second sub-layer 12.

The first sub-layer 11, the third sub-layer 13, and the fourth sub-layer 14 each include a flexible material, and the second sub-layer 12 and the second water and/or oxygen barrier sub-layer 103 each include a water and/or oxygen barrier material.

Optionally, the flexible material includes at least one of polyimide, polycarbonate, polyethersulfone, poly(ethylene terephthalate), poly(ethylene naphthalate), or polyaryl compounds; and the water oxygen barrier material includes at least one of silicon nitride or silicon oxide.

In the present embodiment, the thin film transistor array layer 20 further includes a metal conductive portion 25 disposed on the second gate insulating layer 24 and covered by the planarization layer 41, and the metal conductive portion 25 is electrically connected to the light shielding portion 30 through contact holes passing through the second gate insulating layer 24, the first gate insulating layer 23, the interlayer insulating layer 22, the spacer layer 201, the second water oxygen barrier sub-layer 103, the third sub-layer 13, and the second sub-layer 12 to apply a voltage to the light shielding portion 30, so as to improve the voltage stability thereof, and reduce the influence on the electrical properties of the thin film transistor 21 above the light shielding portion 30.

In view of the foregoing, in the embodiment, by embedding the light shielding portion 30 in the substrate 10, i.e., inserting between the first sub-layer 11 and the second sub-layer 12, extending a distance between the light shielding portion 30 and the active layer 211, thereby reducing an influence of the voltage applied to the light shielding portion 30 on the electrical properties of the channel portion 2111, improving the stability of the thin film transistor 21, and improving the display effect of the display panel. Compared with the preceding embodiment, this embodiment incorporates a new sub-layer 14 disposed on the sub-layer 11 away from the light shielding portion 30 and the sub-layer 14 is made of a flexible material, which can additionally improve bendability and flexibility of the substrate 10.

Figure 4:
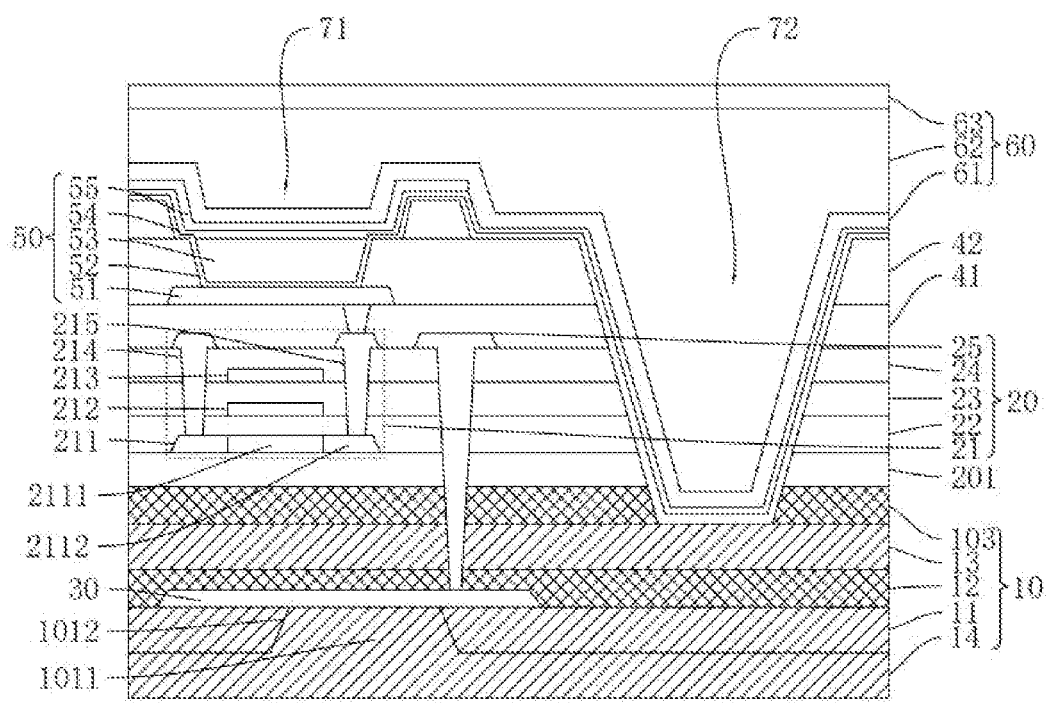
FIG. 4 is another schematic structural diagram of a display panel according to an embodiment of the present application.

Referring to FIG. 4, in another embodiment of the present application, the display panel includes a substrate 10, a spacer layer 201 disposed on the substrate close to a display surface side of the display panel, a thin film transistor array layer disposed on a side of the spacer layer 201 away from the substrate 10, a light shielding portion 30 embedded in the substrate 10, a planarization layer 41 disposed on a side of the thin film transistor array layer 20 away from the substrate 10, a pixel definition layer 42 disposed on a side of the planarization layer 41 away from the thin film transistor array layer 20, a light emitting device layer 50 disposed on a side of the planarization layer 41 away from the thin film transistor array layer 20, and a package layer 60 disposed on a side of the pixel definition layer 42 away from the planarization layer 41.

Further, in the present embodiment, the substrate 10 includes a first sub-layer 11 and a second sub-layer 12 which are layer-wise disposed, and the light shielding portion 30 is disposed between the first sub-layer 11 and the second sub-layer 12, and the first sub-layer 11 is disposed on a side of the second sub-layer 12 away from the spacer layer 201. Further, the substrate 10 also includes a fourth sub-layer 14 disposed on a side of the first sub-layer 11 away from the second sub-layer 12, a third sub-layer 13 disposed on a side of the second sub-layer 12 away from the first sub-layer 11, and a second water and/or oxygen barrier sub-layer 103 disposed on a side of the third sub-layer 13 away from the second sub-layer 12.

The first sub-layer 11, the third sub-layer 13, and the fourth sub-layer 14 each include a flexible material, and the second sub-layer 12 and the second water and/or oxygen barrier sub-layer 103 each include a water and/or oxygen barrier material.

Optionally, the flexible material includes at least one of polyimide, polycarbonate, polyethersulfone, poly(ethylene terephthalate), poly(ethylene naphthalate), or polyaryl compounds; and the water oxygen barrier material includes at least one of silicon nitride or silicon oxide.

In the present embodiment, the thin film transistor array layer 20 further includes a metal conductive portion 25 disposed on the second gate insulating layer 24 and covered by the planarization layer 41, and the metal conductive portion 25 is electrically connected to the light shielding portion 30 through contact holes passing through the second gate insulating layer 24, the first gate insulating layer 23, the interlayer insulating layer 22, the spacer layer 201, the second water oxygen barrier sub-layer 103, the third sub-layer 13, and the second sub-layer 12, to apply a voltage to the light shielding portion 30, so as to improve the voltage stability thereof, and reduce the influence on the electrical properties of the thin film transistor 21 over the light shielding portion 30.

It should be noted that, compared with a previous embodiment, in this embodiment, the fourth sub-layer 14 has at least one convex portion 1011 close to the first sub-layer 11, and the first sub-layer 11 has at least one concave portion 1012 corresponding to the at least one convex portion 1011 close to the fourth sub-layer 14, and the convex portion 1011 is engaged with the concave portion 1012, so as to improve bonding strength between the first sub-layer 11 and the fourth sub-layer 14. Moreover, a patterned structure in which the convex portion and the concave portion are engaged with each other may be disposed between any two adjacent sub-layers in the substrate so as to improve bonding strength between adjacent sub-layers in the substrate.

In view of the foregoing, in the embodiment, by embedding the light shielding portion 30 in the substrate 10, i.e., inserting between the first sub-layer 11 and the second sub-layer 12, the display panel of the present application can extend the distance between the light shielding portion 30 and the active layer 211, thereby reducing the influence of the voltage applied to the light shielding portion 30 on the electrical properties of the channel portion 2111, improving the stability of the thin film transistor 21, and improving the display effect of the display panel. Furthermore, in this embodiment, the inter-fitting structure is formed between the first sub-layer 11 and the fourth sub-layer 14, so that the bonding strength between the first sub-layer 11 and the fourth sub-layer can be improved, thereby improving the stability of the substrate 10.

Figure 5:
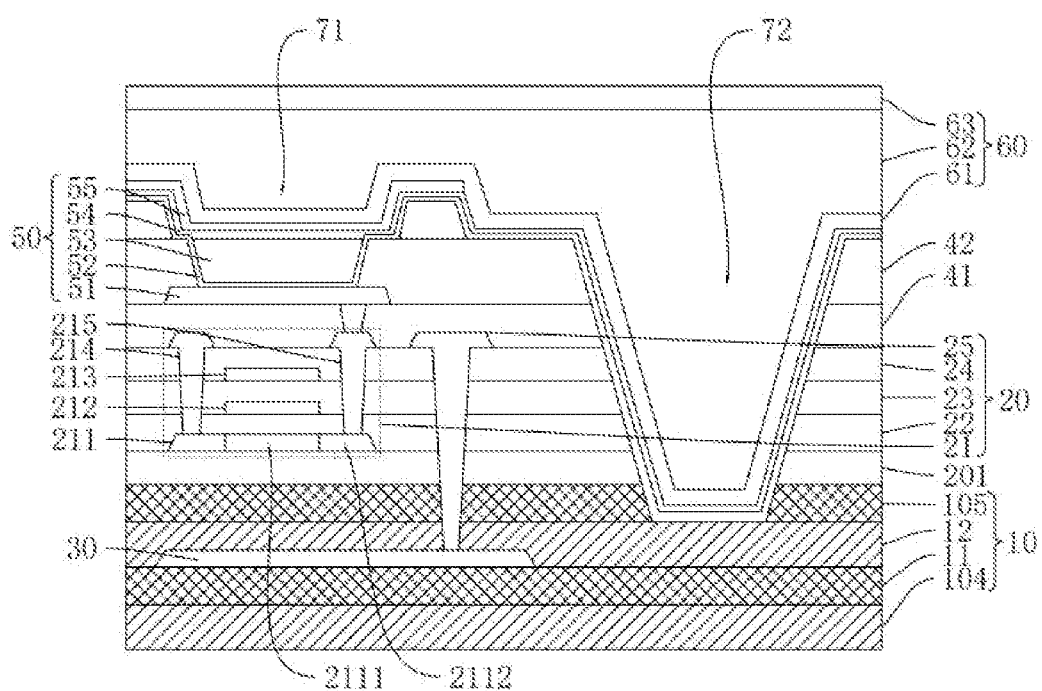
FIG. 5 is another schematic structural diagram of a display panel according to an embodiment of the present application.

Referring to FIG. 5, in another embodiment of the present application, the display panel includes a substrate 10, a spacer layer 201 disposed on the substrate close to a display surface side of the display panel, a thin film transistor array layer disposed on a side of the spacer layer 201 away from the substrate 10, a light shielding portion 30 embedded in the substrate 10, a planarization layer 41 disposed on a side of the thin film transistor array layer 20 away from the substrate 10, a pixel definition layer 42 disposed on a side of the planarization layer 41 away from the thin film transistor array layer 20, a light emitting device layer 50 disposed on a side of the planarization layer 41 away from the thin film transistor array layer 20, and a package layer 60 disposed on a side of the pixel definition layer 42 away from the planarization layer 41.

Further, in the present embodiment, the substrate 10 includes a first sub-layer 11 and a second sub-layer 12 which are layer-wise disposed, and the light shielding portion 30 is disposed between the first sub-layer 11 and the second sub-layer 12, and the first sub-layer 11 is disposed on a side of the second sub-layer 12 away from the spacer layer 201. In addition, the substrate 10 further includes a second flexible sub-layer 104 disposed on the side of the first sub-layer 11 away from the second sub-layer, and a third water and/or oxygen barrier sub-layer 105 disposed on the side of the second sub-layer 12 away from the first sub-layer, and the third water and/or oxygen barrier sub-layer 105 is located between the second sub-layer 12 and the spacer layer 201.

The first sub-layer 11 and the third water and/or oxygen barrier sub-layer 105 each include a water and/or oxygen barrier material, and the second sub-layer 12 and the second flexible sub-layer 104 each include a flexible material.

Optionally, the flexible material includes at least one of polyimide, polycarbonate, polyethersulfone, poly(ethylene terephthalate), poly(ethylene naphthalate), or polyaryl compounds; and the water oxygen barrier material includes at least one of silicon nitride or silicon oxide.

In this embodiment, the thin film transistor array layer 20 further includes a metal conductive portion 25 disposed on the second gate insulating layer 24 and covered by the planarization layer 41, and the metal conductive portion 25 is electrically connected to the light shielding portion 30 through contact holes passing through the second gate insulating layer 24, the first gate insulating layer 23, the interlayer insulating layer 22, the spacer layer 201, the third water oxygen barrier sub-layer 105, and the second sub-layer 12 to apply a voltage to the light shielding portion so as to improve the voltage stability thereof, and reduce the influence on the electrical properties of the thin film transistor 21 over the light shielding portion 30.

In view of the foregoing, in the embodiment, by embedding the light shielding portion 30 in the substrate 10, i.e., inserting between the first sub-layer 11 and the second sub-layer 12, compared with the first embodiment, the third water barrier layer 105 is further provided between the shielding portion 30 and the active layer 211, which enlarges the distance between the light shielding portion 30 and the active layer 211, thereby reducing the influence of the voltage applied to the light shielding portion on the electrical properties of the channel portion 2111, improving the stability of the thin film transistor 21, and improving the display effect of the display panel.

Figure 6:
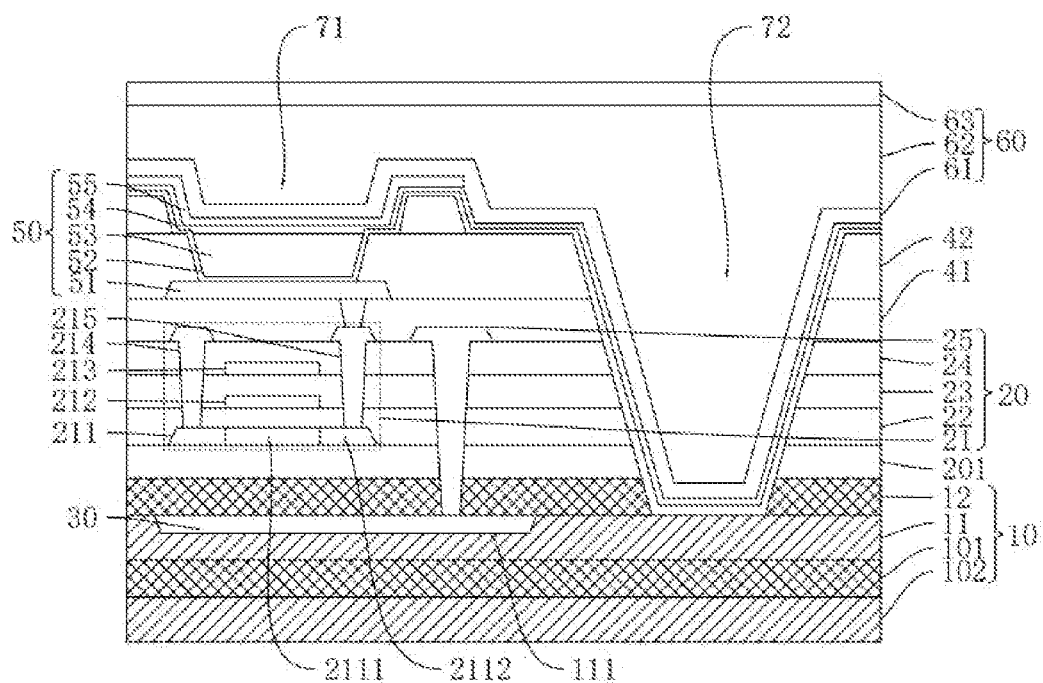
FIG. 6 is another schematic structural diagram of a display panel according to an embodiment of the present application.

Referring to FIG. 6, in another embodiment of the present application, the display panel includes a substrate 10, a spacer layer 201 disposed on the substrate close to a display surface side of the display panel, a thin film transistor array layer disposed on a side of the spacer layer 201 away from the substrate 10, a light shielding portion 30 embedded in the substrate 10, a planarization layer 41 disposed on a side of the thin film transistor array layer 20 away from the substrate 10, a pixel definition layer 42 disposed on a side of the planarization layer 41 away from the thin film transistor array layer 20, a light emitting device layer 50 disposed on a side of the planarization layer 41 away from the thin film transistor array layer 20, and a package layer 60 disposed on a side of the pixel definition layer 42 away from the planarization layer 41.

Further, in the present embodiment, the substrate 10 includes a first sub-layer 11 and a second sub-layer 12 which are layer-wise disposed, and the light shielding portion 30 is disposed between the first sub-layer 11 and the second sub-layer 12, and the first sub-layer 11 is disposed on a side of the second sub-layer 12 away from the spacer layer 201. In addition, the substrate further includes a first water and/or oxygen barrier sub-layer 101 disposed on a side of the first sub-layer 11 away from the second sub-layer 12 and a first flexible sub-layer 102 disposed on a side of the first water and/or oxygen barrier sub-layer 101 away from the first sub-layer 11.

The first sub-layer 11 and the first flexible sub-layer 102 each comprise a flexible material, and the second sub-layer and the first water and/or oxygen barrier sub-layer 101 each comprise a water and/or oxygen barrier material.

Optionally, the flexible material includes at least one of polyimide, polycarbonate, polyethersulfone, poly(ethylene terephthalate), poly(ethylene naphthalate), or polyaryl compounds; and the water oxygen barrier material includes at least one of silicon nitride or silicon oxide.

In the present embodiment, the thin film transistor array layer 20 further includes a metal conductive portion 25 disposed on the second gate insulating layer 24 and covered by the planarization layer 41, and the metal conductive portion 25 is electrically connected to the light shielding portion 30 through contact holes passing through the second gate insulating layer 24, the first gate insulating layer 23, the interlayer insulating layer 22, the spacer layer 201, and the second sub-layer 12 to apply a voltage to the light shielding portion 30, improve the voltage stability thereof, and reduce the influence on the electrical properties of the thin film transistor 21 over the light shielding portion 30.

It should be noted that, in contrast to the first embodiment, in this embodiment, the groove 111 is defined on a side of the first sub-layer 11 close to the second sub-layer 12, and the light shielding portion 30 is disposed in the groove 111, so as to improve a smoothness of a connection interface between the first sub-layer 11 and the second sub-layer 12, reduce a climbing structure in a film-layer morphology of the second sub-layer 12, and further improve the bonding strength between the first sub-layer 11 and the second sub-layer 12.

In view of the foregoing, in the embodiment, by embedding the light shielding portion 30 in the substrate 10, i.e., inserting between the first sub-layer 11 and the second sub-layer 12, the display panel can extend the distance between the light shielding portion 30 and the active layer 211, thereby reducing the influence of the voltage applied to the light shielding portion 30 on the electrical properties of the channel portion 2111, improving the stability of the thin film transistor 21, and improving the display effect of the display panel. Furthermore, a groove 111 is incorporated in the first sub-layer 11 and the shielding portion 30 is disposed in the groove 111, through which the film segment difference between the first sub-layer 11 and the second sub-layer 12 is reduced.

Figure 7:
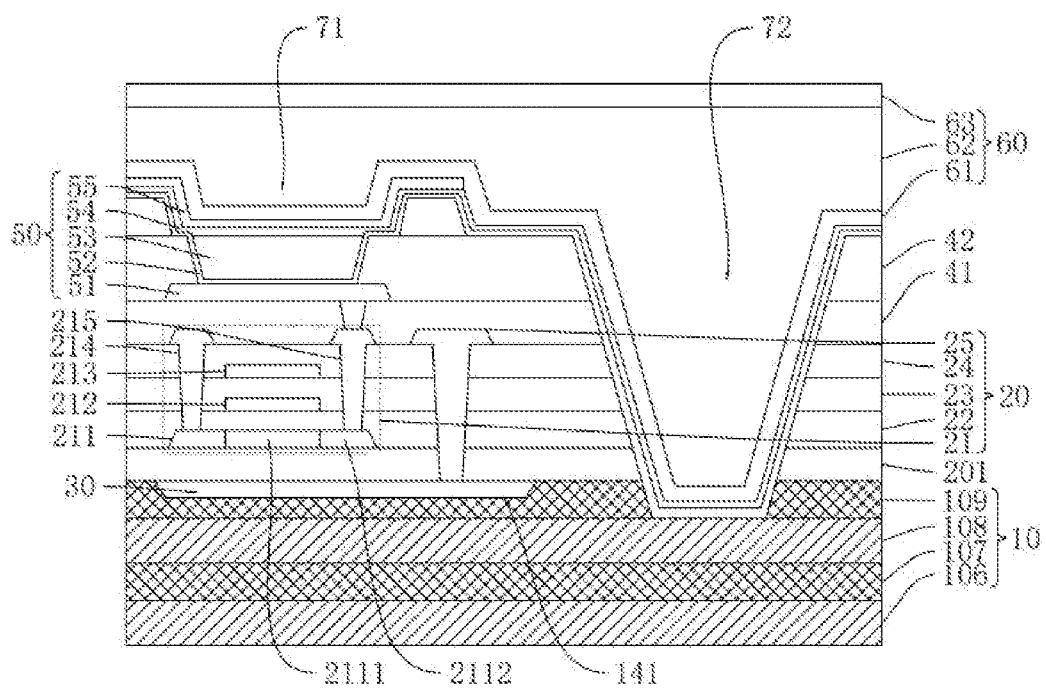
FIG. 7 is another schematic structural diagram of a display panel according to an embodiment of the present application.

Referring to FIG. 7, in another embodiment of the present application, the display panel includes a substrate 10, a spacer layer 201 disposed on the substrate 10 side close to the display surface of the display panel, a thin film transistor array layer 20 disposed on a side of the spacer layer 201 away from the substrate 10, a light shielding portion 30 embedded in the substrate 10, a planarization layer 41 disposed on a side of the thin film transistor array layer 20 away from the substrate 10, a pixel definition layer 42 disposed on a side of the planarization layer 41 away from the thin film transistor array layer 20, a light emitting device layer 50 disposed on a side of the planarization layer 41 away from the thin film transistor array layer 20, and a package layer 60 disposed on a side of the pixel definition layer 42 away from the planarization layer 41.

Further, in the present embodiment, the substrate 10 includes a third flexible sub-layer 106, a fourth water oxygen barrier sub-layer 107, a fourth flexible sub-layer 108, and a fifth water oxygen barrier sub-layer 109, which are laminated together, wherein a side of the substrate 10 on which the fifth water oxygen barrier sub-layer 109 is disposed is close to the spacer layer 201.

The materials of the third flexible sub-layer 106 and the fourth flexible sub-layer 108 each include a flexible material, and the materials of the fourth water oxygen barrier sub-layer 107 and the fifth water oxygen barrier sub-layer 109 each include a water oxygen barrier material.

Optionally, the flexible material includes at least one of polyimide, polycarbonate, polyethersulfone, poly(ethylene terephthalate), poly(ethylene naphthalate), or polyaryl compounds; and the water oxygen barrier material includes at least one of silicon nitride or silicon oxide.

In this embodiment, the thin film transistor array layer 20 further includes a metal conductive portion 25 disposed on the second gate insulating layer 24 and covered by the planarization layer 41, and the metal conductive portion 25 is electrically connected to the light shielding portion 30 through contact holes passing through the second gate insulating layer 24, the first gate insulating layer 23, the interlayer insulating layer 22, and the spacer layer 201, so that a voltage is applied to the light shielding portion 30, the voltage stability thereof is improved, and the influence on the electrical properties of the thin film transistor 21 over the light shielding portion 30 is reduced.

It should be noted that in the present embodiment, a groove body 141 is defined on the side of the fifth water oxygen barrier sub-layer 109 close to the spacer layer 201, and the light shielding portion 30 is disposed in the groove body 141 so as to improve the smoothness of the connection interface between the fifth water oxygen barrier sub-layer 109 and the spacer layer 201, reduce a climbing structure in a film-layer morphology of the spacer layer 201, and further improve the bonding strength between the fifth water oxygen barrier sub-layer 109 and the spacer layer 201.

Further, a depth of the groove body 141 may be greater than or equal to a thickness of the light shielding portion 30 so as to increase a distance between the light shielding portion 30 and the active layer 211 as much as possible.

In view of the foregoing, in the embodiment, by embedding the light shielding portion 30 in the substrate 10, i.e., embedding in the fifth water oxygen barrier sub-layer 109, compared with the prior art, the display panel can extend the distance between the light shielding portion 30 and the active layer 211, thereby reducing the influence of the voltage applied to the light shielding portion 30 on the electrical properties of the channel portion 2111, improving the stability of the thin film transistor 21, and improving the display effect of the display panel.

It is to be understood that all the substrates 10 described in the above embodiments are multi-sub-layer composite structures, and the light shielding portion can be disposed between any two adjacent sub-layers of the composite structure, and a number of sub-layers of the substrate 10 is not limited to those illustrated in the above embodiments, and may be more than the number of sub-layers described in the above embodiments or less than the number of sub-layers described in the above embodiments. Further, the substrate 10 described in the embodiments of the present application may also be a single-layer structure. For example, the substrate 10 may be an organic or inorganic glass substrate, and a hole/groove may be formed in the substrate 10 so that the light shielding portion 30 may be disposed in the hole/groove, and then the light shielding portion 30 embedded in the substrate 10 is realized, so as to increase the distance between the light shielding portion 30 and the active layer 211.

In addition, in the embodiment of the present application, the display panel includes a plurality of pixel regions, the thin film transistor array layer 20 includes a plurality of thin film transistors 21, and the plurality of thin film transistors 21 includes a switching transistor and a driving transistor that are disposed within each pixel region and are electrically connected. And the light shielding portion 30 is disposed in the substrate 10 corresponding to at least the active layer 211 of the switching transistor and the active layer 211 of the driving transistor.

That is, at least an orthographic projection of the channel portion 2111 of the active layer 211 of the switching transistor on the substrate 10 and an orthographic projection of the channel portion 2111 of the active layer 211 of the driving transistor on the substrate 10 are within a coverage area of an orthographic projection of the light shielding portion 30 on the substrate 10. Preferably, an orthographic projection of the active layer 211 of the switching transistor on the substrate 10 and an orthographic projection of the active layer 211 of the driving transistor on the substrate are both within the coverage area of the orthographic projection of the light shielding portion 30 on the substrate 10, so as to protect the main thin film transistor devices in the pixel driving circuit.

The gate of the switching transistor receives a scan signal and is turned on to transmit an electrical signal to a gate electrode of the driving transistor, and the driving transistor is turned on. In the meanwhile, a source electrode of the driving transistor receives a display luminance signal to transmit the display luminance signal to an anode 51 via a drain electrode to realize a light emission of a light emitting layer 53. Therefore, the switching transistor and the driving transistor are important transistor devices for the light emission of each pixel region, and the disposition of the light shielding portion 30 with respect to the switching transistor and the driving transistor in the embodiment of the present application can effectively ensure normal light emission of each pixel.

The diagram provided in the embodiment of the present application only shows a corresponding structure of one of the thin film transistor 21 and the light shielding portion 30 as an example for description, and other corresponding structures of the thin film transistor 21 and the light shielding portion 30 may be provided with reference to the drawings, and details are not repeated here.

An embodiment of the present application provides a display device, and the display device includes a display panel and a device body, and the display panel is integrated with the device body. It can be understood that, when the display panel described in the embodiments of the present application is applied to a transparent display device or another type of display device, the arrangement of the light shielding portion 30 can shield a backlight from irradiating to the channel portion 2111 of the active layer 211, or increase the distance between the light shielding portion 30 and the active layer 211, thereby reducing the influence of the voltage applied to the light shielding portion 30 on the electrical properties of the channel portion 2111, improving the stability of the thin film transistor 2111, and improving the display effect of the display panel.

In the above-described embodiments, the descriptions of the various embodiments have its own emphasis, and portions of some embodiments that are not detailed may be referred to the related descriptions of other embodiments.

The display panel and the display device illustrated in the embodiments of the present application are described in detail above. The principles and embodiments of the present application are described in detail in the context. The description of the embodiments is merely intended to help understand the technical solutions and core ideas of the present application. Those of ordinary skill in the art will appreciate that they may still modify the technical solutions described in the foregoing embodiments, or equivalently replace some of the technical features therein. These modifications or substitutions do not deviate the nature of the respective solutions from the scope of the solutions of the embodiments of the present application.

What is claimed is:

1. A display panel, characterized in that the display panel comprises:
    a substrate;
    a thin film transistor array layer disposed on a side of the substrate, wherein the thin film transistor array layer includes at least one thin film transistor, and the thin film transistor comprises an active layer disposed on a side of the substrate; the active layer includes a channel portion and electrical connection portions located on both sides of the channel portion; and at least one spacer layer is disposed between the substrate and the thin film transistor array layer; and
    a light shielding portion embedded in the substrate, wherein an orthographic projection of the channel portion on the substrate is located in a coverage area of an orthographic projection of the light shielding portion on the substrate;
    wherein the substrate includes a first sub-layer and a second sub-layer which are disposed layer-wise, the second sub-layer is disposed on a side of the spacer layer away from the thin film transistor array layer, the first sub-layer is disposed on a side of the second sub-layer away from the spacer layer, and the light shielding portion is disposed between the first sub-layer and the second sub-layer; and
    the substrate further comprises a third sub-layer disposed on a side of the second sub-layer away from the first sub-layer, and a material of the third sub-layer includes the flexible material.

2. The display panel according to claim 1, wherein a material of the first sub-layer comprises a flexible material, and a material of the second sub-layer comprises a water and/or oxygen barrier material.

3. The display panel according to claim 1, wherein the substrate further includes a fourth sub-layer disposed on a side of the first sub-layer away from the second sub-layer, and a material of the fourth sub-layer includes the flexible material.

4. The display panel according to claim 3, wherein the flexible material comprises at least one of polyimide, polycarbonate, polyethersulfone, poly (ethylene terephthalate), poly (ethylene naphthalate), or polyaryl compounds; and
    the water and/or oxygen barrier material comprises at least one of silicon nitride or silicon oxide.

5. The display panel according to claim 3, wherein the fourth sub-layer has at least one convex portion on a side close to the first sub-layer, the first sub-layer has at least one concave portion corresponding to at least one of the convex portions on a side close to the fourth sub-layer, and the convex portion is engaged with the concave portion.

6. The display panel according to claim 1, wherein the substrate further includes a fifth sub-layer disposed on a side of the first sub-layer away from the second sub-layer, and a material of the second sub-layer and a material of the fifth sub-layer both comprise a flexible material, and a material of the first sub-layer comprises a water and/or oxygen barrier material.

7. The display panel according to claim 6, wherein the flexible material comprises at least one of polyimide, polycarbonate, polyethersulfone, poly (ethylene terephthalate), poly (ethylene naphthalate), or polyaryl compounds; and
    the water and/or oxygen barrier material includes at least one of silicon nitride or silicon oxide.

8. The display panel according to claim 1, wherein a groove is defined on a side of the first sub-layer close to the second sub-layer, and the light shielding portion is disposed in the groove.

9. The display panel according to claim 1, wherein the thin film transistor array layer includes a metal conductive portion disposed on a side of the spacer layer away from the substrate, the display panel includes a contact hole located between the metal conductive portion and the light shielding portion, and the metal conductive portion contacts the light shielding portion through the contact hole by overlapping.

10. The display panel according to claim 9, wherein the thin film transistor includes at least one gate electrode disposed on a side of the active layer and a source/drain electrode disposed on a side of at least one gate electrode, and the metal conductive portion is disposed on a same layer as one of the at least one gate electrode and the source/drain electrode.

11. The display panel according to claim 1, wherein the display panel includes a plurality of pixel regions, the thin film transistor array layer includes a plurality of the thin film transistors, the plurality of the thin film transistors include a switching transistor and a driving transistor disposed within each of the pixel regions and electrically connected, wherein an orthographic projection of the active layer of the switching transistor on the substrate and an orthographic projection of the active layer of the driving transistor on the substrate are both located within an area covered by the orthographic projection of the light shielding portion on the substrate.

12. A display device, comprising a display panel and a device body, and the display panel is integrated with the device body;
wherein the display panel comprises
a substrate;
a thin film transistor array layer disposed on one side of the substrate, wherein thin film transistor array layer includes at least one thin film transistor, wherein the thin film transistor includes an active layer disposed on one side of the substrate, the active layer includes a channel portion and electrical connection portions disposed on both sides of the channel portion; and at least one spacer layer is disposed between the substrate and the thin film transistor array layer; and
a light shielding portion embedded in the substrate, and an orthographic projection of the channel portion on the substrate is located within a coverage area of an orthographic projection of the light shielding portion on the substrate;
wherein the substrate includes a first sub-layer and a second sub-layer which are disposed layer-wise, the second sub-layer is disposed on a side of the spacer layer away from the thin film transistor array layer, the first sub-layer is disposed on a side of the second sub-layer away from the spacer layer, and the light shielding portion is disposed between the first sub-layer and the second sub-layer; and
the substrate further comprises a third sub-layer disposed on a side of the second sub-layer away from the first sub-layer, and a material of the third sub-layer includes the flexible material.

13. The display device according to claim 12, wherein the first sub-layer comprises a flexible material, and the second sub-layer comprises a water and/or oxygen barrier material.

14. The display device according to claim 12, wherein the substrate further includes a fourth sub-layer disposed on a side of the first sub-layer away from the second sub-layer, and the fourth sub-layer includes the flexible material.

15. The display device according to claim 12, wherein the substrate further includes a fifth sub-layer disposed on a side of the first sub-layer away from the second sub-layer, and the second sub-layer and the fifth sub-layer both include a flexible material, and the first sub-layer includes a water and/or oxygen barrier material.

16. The display device according to claim 12, wherein the thin film transistor array layer includes a metal conductive portion disposed on a side of the spacer layer away from the substrate, the display panel includes a contact hole between the metal conductive portion and the light shielding portion, and the metal conductive portion overlaps the light shielding portion through the contact hole.

17. The display device according to claim 14, wherein the substrate further includes a fifth sub-layer disposed on a side of the first sub-layer away from the second sub-layer, and the second sub-layer and the fifth sub-layer both include a flexible material, and the first sub-layer includes a water and/or oxygen barrier material.

18. A display panel, characterized in that the display panel comprises:
a substrate;
a thin film transistor array layer disposed on a side of the substrate, wherein the thin film transistor array layer includes at least one thin film transistor, and the thin film transistor comprises an active layer disposed on a side of the substrate; the active layer includes a channel portion and electrical connection portions located on both sides of the channel portion; and at least one spacer layer is disposed between the substrate and the thin film transistor array layer; and
a light shielding portion embedded in the substrate, wherein an orthographic projection of the channel portion on the substrate is located in a coverage area of an orthographic projection of the light shielding portion on the substrate;
wherein the substrate includes a first sub-layer and a second sub-layer which are disposed layer-wise, the second sub-layer is disposed on a side of the spacer layer away from the thin film transistor array layer, the first sub-layer is disposed on a side of the second sub-layer away from the spacer layer, and the light shielding portion is disposed between the first sub-layer and the second sub-layer; and
wherein the substrate further comprises
a third sub-layer disposed on a side of the second sub-layer away from the first sub-layer, and a material of the third sub-layer includes the flexible material;
a fourth sub-layer disposed on a side of the first sub-layer away from the second sub-layer, and a material of the fourth sub-layer includes the flexible material; and
a fifth sub-layer disposed on a side of the first sub-layer away from the second sub-layer, and a material of the second sub-layer and a material of the fifth sub-layer both comprise a flexible material, and a material of the first sub-layer comprises a water and/or oxygen barrier material.

* * * * *